United States Patent [19]

Kishida

[11] Patent Number: 4,511,854
[45] Date of Patent: Apr. 16, 1985

[54] AUTOMATIC LINEARITY CORRECTING CIRCUIT

[75] Inventor: Toshio Kishida, Tokyo, Japan
[73] Assignee: Clarion Co., Ltd., Tokyo, Japan
[21] Appl. No.: 472,736
[22] Filed: Mar. 7, 1983
[30] Foreign Application Priority Data

Mar. 11, 1982 [JP] Japan ................... 57-39237

[51] Int. Cl.³ ............................. H03G 3/30
[52] U.S. Cl. ............................. 330/279; 330/300
[58] Field of Search .......... 330/149, 277, 279, 285, 330/300, 311

[56] References Cited
FOREIGN PATENT DOCUMENTS 846 1/1979 Japan ................... 330/277

Primary Examiner—James B. Mullins
Assistant Examiner—Steven J. Mottola
Attorney, Agent, or Firm—Russell E. Hattis; Stephen R. Arnold

[57] ABSTRACT

An automatic linearity correcting circuit comprises a junction-type active element, a dual gate MOSFET, an AGC circuit to keep output signal from the dual gate MOSFET at a predetermined level and a correcting voltage applying circuit to convert AGC voltage to a voltage most suitable for linearity correction, so that output signal from the junction-type active element is applied to one of gates of the dual gate MOSFET, and correcting voltage from the correcting voltage applying circuit is applied to the other gate of the MOSFET.

4 Claims, 6 Drawing Figures

AUTOMATIC LINEARITY CORRECTING CIRCUIT

BACKGROUND OF THE INVENTION

This invention relates to an automatic linearity correction circuit designed to improve the linearity of outputs of junction transistors by use of the properties of dual-gate MOSFET.

Junction-type active elements such as a junction transistor, junction field-effect transistor, junction diode, etc. are generally used for amplification, modulation and demodulation of weak signals. FIGS. 1A and 1B show examples of static characteristic curves of a junction transistor and of a junction field-effect transistor. These curves apply to amplification, modulation and demodulation of said weak signals.

When these static characteristic curves as shown in FIGS. 1A and 1B are obeyed, however, it is difficult to completely maintain linearity between input and output, resulting in bad linearity, because an output signal taken from a point near a strongly rising region of collector current IC or drain current ID is not proportional to the input signal.

OBJECT OF THE INVENTION

It is therefore an object of the present invention to overcome the above-mentioned drawback involved in the prior art, and to provide an automatic linearity correction circuit capable of automatically restoring the linearity of signals which have been distorted by junction-type active elements, and over a wide range of input level.

SUMMARY OF THE INVENTION

To attain this objective, the automatic linearity correction circuit is designed so as to provide one of the gates of a dual-gate MOSFET with the output from a junction-type active element and to provide the other gate with a linearity correcting voltage.

DETAILED DESCRIPTION OF THE PREFERRED EMBODIMENT

Figure 1A:
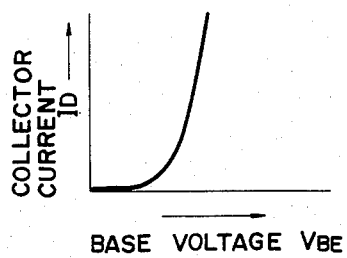
FIGS. 1A, 1B, 2A and 2B show characteristic curves to explain the present invention.
Figure 1B:
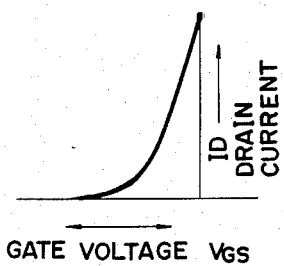
Figure 2A:
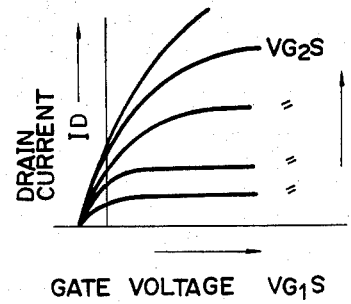
Figure 2B:
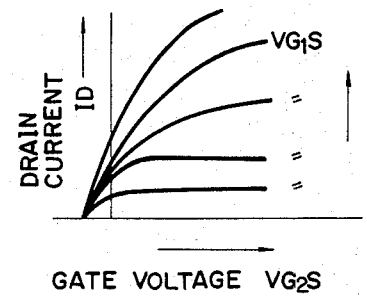

FIGS. 2A and 2B show the static characteristics of a dual gate MOSFET. In this Figure, the abscissa is the gate-to-source voltage of first gate $G_1$ while the abscissa of FIG. 2 is gate-to-source voltage of second gate $G_2$. The rising formats of the curves in FIGS. 2A and 2B are different from those in FIGS. 1A and 1B. This means that, by selecting an adequate operating point, it is possible to restore the linearity of a signal which has been degraded by a junction-type active element.

Use of the nature of a dual gate MOSFET for such linearity correction is the principle of the present invention.

Figure 3:
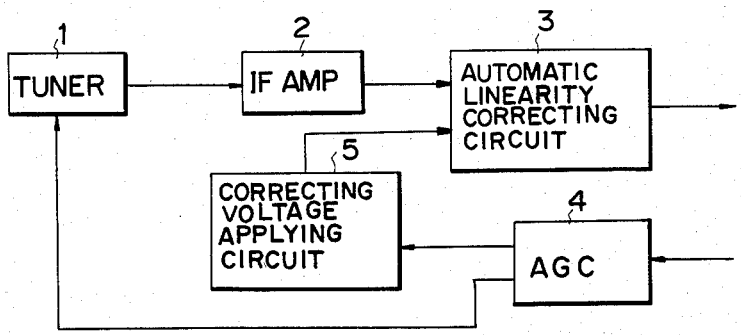
FIGS. 3 and 4 are a block diagram and a circuit diagram both showing an embodiment of this invention.

FIG. 3 shows a block diagram wherein an embodiment according to the present invention is used in a video intermediate frequency (IF) amplifier circuit in a conventional TV receiver. The reference numeral 1 designates a tuner circuit, 2 is an IF amplifier circuit, 3 is an automatic linearity correcting circuit, 4 is a reverse automatic gain control (AGC) circuit and 5 is a correcting voltage applying circuit.

Figure 4:
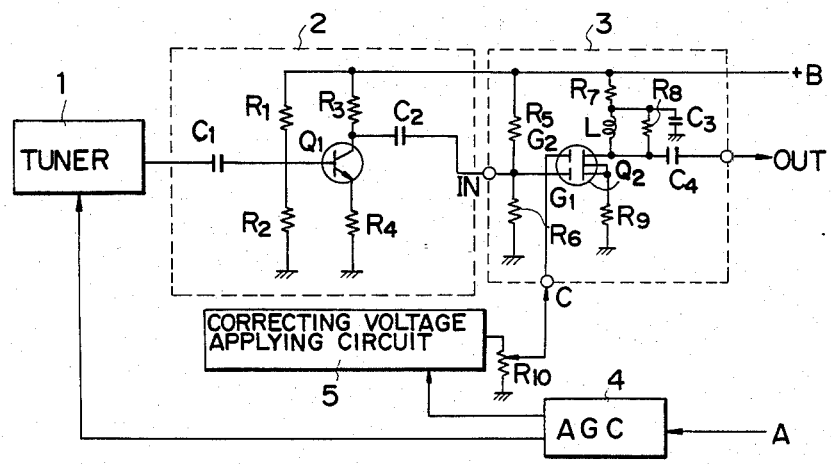

FIG. 4 shows a circuit diagram of an embodiment of the IF amplifier circuit 2 and the linearity correcting circuit 3. $R_1$ to $R_{10}$ denote resistors, $C_1$ to $C_4$ are capacitors, L is an inductance, $Q_1$ is a junction transistor, $Q_2$ is a dual gate MOSFET, $G_1$ is its first gate, and $G_2$ is its second gate.

A signal supplied from the tuner circuit 1 is applied to the junction transistor $Q_1$ by way of the capacitor $C_1$. The junction transistor $Q_1$ operates as an IF amplifier circuit to obtain the necessary gain. A signal from the junction transistor $Q_1$ is applied to the first gate $G_1$ of the dual gate MOSFET $Q_2$ through the capacitor $C_2$ from the input terminal IN. The first gate $G_1$ is provided with dc bias $V_{G1}$ which is a part of source power suitably divided by the resistors $R_5$ and $R_6$, while the second gate $G_2$ is provided with a correcting voltage $V_{G2}$ from the correcting voltage applying circuit 5.

The IF signal amplified by the junction transistor $Q_1$ is supplied from the output terminal OUT of the dual gate MOSFET $Q_2$ and sent to a detection stage (not shown). A detection signal from the detection stage is fed back to the tuner 1 through a reverse (i.e. conventional backward acting) AGC circuit 4, thereby maintaining a constant level at the output OUT as is conventionally known. The AGC voltage from the AGC circuit 4 is applied to the correcting voltage applying circuit 5 and is converted to the most suitable value for linearity correction. This value is automatically modified to be the best for linearity correction in accordance with the level of the detection signal. Therefore, the second gate $G_2$ is always supplied with a correcting voltage of the most suitable value.

When the signal level applied to the junction transistor $Q_1$ becomes large, the input signal to the first gate $G_1$ of the dual gate MOSFET $Q_2$ and therefore the output signal at the output terminal OUT also become large. However, due to the action of the AGC circuit 4 and of the correcting voltage applying circuit 5, the correcting voltage $V_{G2}$ applied to the second gate $G_2$ from the terminal C becomes small. This means that, in FIG. 2A, when gate voltage $V_{G1S}$ is fixed bias, the gate voltage $V_{G2S}$ decreases. Therefore, drain current ID decreases and the rising curve is flattened.

Also in FIG. 2B, when gate voltage $V_{G1S}$ varies while the gate voltage $V_{G2S}$ is fixed, the rising format of drain current ID is the same as FIG. 2A.

Further, when the signal from the input terminal IN is applied to the dual gate MOSFET $Q_2$ through the junction transistor $Q_1$ (junction-type active element) with bias condition of the junction transistor $Q_1$ being class A, collector current IC or drain current ID is positioned on a more moderate part of the curve as input signal level increases, as compared to characteristics of junction-type active elements of FIGS. 1A and 1B, whereby linearity of output signal of the junction transistor $Q_1$ is worsened.

However, since the rising characteristics of the junction transistor $Q_1$ and of the dual gate MOSFET $Q_2$ are in relation to compensate each other as apparent from FIGS. 1A and 2B, even when an output signal with poor linearity is supplied from the junction transistor $Q_1$ to the MOSFET $Q_2$, the linearity is automatically corrected, and the most suitable correcting voltage can be always obtained by the AGC circuit 4 and the correcting voltage applying circuit 5.

As described above, the circuit of the present invention is designed so as to correct linearity degradation by junction-type active elements by use of the characteristics of a dual gate MOSFET; hence, it is possible to preserve input-to output linearity during amplification, modulation and demodulation of a small signal.

I claim:

1. In a combination of an amplifying stage having a junction-type active element exhibiting a nonlinear transfer characteristic causing signal distortion increasing with signal level, a signal source coupled to the input of said amplifying stage, the output level of said signal source being controllably responsive to a gain control or first biasing signal coupled to said signal source, a dual-gate field-effect transistor element having a first gate thereof coupled to the output of said amplifying stage, and a backward-acting automatic gain control circuit including a signal level detection circuit responsively coupled to the output of said dual-gate element for providing said first biasing signal to said signal source responsively to the magnitude of the signal level output of said dual-gate element and generally increasing in strength therewith so as to maintain said dual-gate element output signal level at a substantially constant value, the improvement wherein:

said automatic gain control circuit includes a linearity correcting voltage circuit responsively coupled to said detection circuit and coupled to provide a linearity correcting or second bias voltage to the second gate of said dual-gate element, said dual-gate element having a nonlinear transfer characteristic at said first gate generally complementary to that of said junction-type device and having the degree of nonlinearity controllably responsive to biasing voltage applied to said second gate, said correcting voltage having a relatively strong value for weak values of amplifying stage output signal level and a relatively weak value for strong amplifying stage output signal levels so as to control the nonlinearity of said dual-gate element to at least partially compensate for said nonlinear transfer characteristics of said junction-type active element.

2. The combination of claim 1 wherein said active element is a junction transistor element including an emitter, a base, and a collector.

3. The combination of claim 1 wherein said linearity correcting voltage is applied only to said second gate and not to said first gate.

4. The combination of claim 1 wherein said dual-gate element is a metal-insulator-semiconductor field-effect transistor.

* * * * *